(12) United States Patent
Lee et al.

(10) Patent No.: US 10,568,194 B2
(45) Date of Patent: Feb. 18, 2020

(54) COMMON MODE FILTER

(71) Applicant: SAMSUNG ELECTRO-MECHANICS CO., LTD., Suwon-Si, Gyeonggi-Do (KR)

(72) Inventors: Kwang Jik Lee, Suwon-Si (KR); Sang Moon Lee, Suwon-si (KR); Hye Hun Park, Suwon-si (KR); Ju Hwan Yang, Suwon-si (KR); Jung Wook Seo, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 309 days.

(21) Appl. No.: 15/792,237

(22) Filed: Oct. 24, 2017

(65) Prior Publication Data

US 2018/0199420 A1 Jul. 12, 2018

(30) Foreign Application Priority Data

Jan. 9, 2017 (KR) ........................ 10-2017-0002893

(51) Int. Cl.
*H05F 3/04* (2006.01)
*H01F 27/36* (2006.01)
(Continued)

(52) U.S. Cl.
CPC ............... *H05F 3/04* (2013.01); *H01F 27/29* (2013.01); *H01F 27/32* (2013.01); *H01F 27/362* (2013.01);
(Continued)

(58) Field of Classification Search
CPC ........ H01F 27/29; H01F 27/32; H01F 27/362; H01F 2017/0093; H03H 1/00; H03H 7/427; H03H 2001/0092; H05F 3/04
(Continued)

(56) References Cited

U.S. PATENT DOCUMENTS 6,819,533 B2 11/2004 Noma et al.
9,236,182 B2 1/2016 Sim et al.
(Continued)

FOREIGN PATENT DOCUMENTS

CN 104637653 A 5/2015
CN 105375458 A 3/2016
(Continued)

OTHER PUBLICATIONS

Machine translation of Iseki et al. Japanese Patent Document JP 2007-265713 A Oct. 11, 2007 (Year: 2007).*
(Continued)

*Primary Examiner* — Kevin J Comber
(74) *Attorney, Agent, or Firm* — Morgan, Lewis & Bockius LLP

(57) ABSTRACT

A common mode filter includes a body including a filter portion and an electrostatic protection portion, first to fourth external electrodes disposed on an external surface of the body, a ground electrode disposed on the external surface of the body, a first coil included in the filter portion and electrically connected to the first and second external electrodes, and a second coil included in the filter portion and electrically connected to the third and fourth external electrodes. The electrostatic protection portion includes discharge electrodes electrically connected to at least one of the first to fourth external electrodes and the ground electrode, a discharge part including conductive particles, a first organic-inorganic composite insulating layer disposed on the discharge electrodes and the discharge part, a magnetic cover layer disposed on the first organic-inorganic composite insulating layer, and a first inorganic insulating layer.

15 Claims, 4 Drawing Sheets

(51) Int. Cl.
  *H01F 27/29* (2006.01)
  *H01F 27/32* (2006.01)
  *H03H 1/00* (2006.01)
  *H03H 7/42* (2006.01)
  *H01F 17/00* (2006.01)

(52) U.S. Cl.
  CPC .............. *H03H 1/00* (2013.01); *H03H 7/427* (2013.01); *H01F 2017/0093* (2013.01); *H03H 2001/0092* (2013.01)

(58) Field of Classification Search
  USPC .......................................................... 361/220
  See application file for complete search history.

(56) References Cited

U.S. PATENT DOCUMENTS

| | | |
|---|---|---|
| 2001/0014001 A1 | 8/2001 | Aoshima et al. |
| 2001/0014412 A1 | 8/2001 | Jongill et al. |
| 2014/0192452 A1 | 7/2014 | Lee et al. |
| 2015/0130580 A1 | 5/2015 | Lee et al. |
| 2015/0130581 A1 | 5/2015 | Sim et al. |
| 2016/0149397 A1 | 5/2016 | Kim et al. |

FOREIGN PATENT DOCUMENTS

| | | |
|---|---|---|
| JP | 2001229511 A | 8/2001 |
| JP | 2001229515 A | 8/2001 |
| JP | 2007-265713 A | 10/2007 |
| JP | H02-123510 A | 5/2011 |
| KR | 10-1376584 B1 | 3/2014 |
| KR | 10-2014-0089950 A | 7/2014 |
| KR | 10-2015-0055440 A | 5/2015 |
| KR | 10-2015-0055441 A | 5/2015 |

OTHER PUBLICATIONS

Office Action issued in corresponding Korean Patent Application No. 10-2017-0002893, dated Nov. 15, 2017, with English Translation.
Chinese Office Action dated Jan. 18, 2019 issued in Chinese Patent Application No. 201711458712.8 (with English translation).

* cited by examiner

COMMON MODE FILTER

CROSS-REFERENCE TO RELATED APPLICATION(S)

This application claims benefit of priority to Korean Patent Application No. 10-2017-0002893 filed on Jan. 9, 2017 in the Korean Intellectual Property Office, the disclosure of which is incorporated herein by reference in its entirety.

TECHNICAL FIELD

The present disclosure relates to a common mode filter.

BACKGROUND

With the advancement of various technologies, electronic devices such as mobile phones, home appliances, PCs, PDAs, LCDs, and the like, have changed from analog type devices to digital type devices and have tended to have a higher processing speed due to an increase in amounts of processed data. In line with this, USB 2.0, USB 3.0, and high-definition multimedia interface (HDMI) have become prevalent as high-speed signal transmission interfaces and have been used in digital devices such as personal computers and digital HD televisions.

Such high speed interfaces employ a differential signal system which transmits a differential signal (differential mode signal) using a pair of signal lines, unlike single-end transmission systems which have generally been used in the art. However, high-speed digitalized electronic devices are sensitive to external stimuli, involving frequent signal distortion due to high frequency noise.

Such an abnormal voltage and noise result from a switching voltage generated in a circuit, power noise included in a source voltage, an unnecessary electromagnetic signal, electromagnetic noise, and the like, and a common mode filter (CMF) is used to prevent the introduction of such an abnormal voltage and high frequency noise to a circuit.

SUMMARY

An aspect of the present disclosure may provide a structure capable of preventing the occurrence of a leakage current between an organic-inorganic composite insulating layer and a magnetic cover layer when an overvoltage due to a phenomenon such as static electricity is applied in a common mode filter including an electrostatic protection portion.

According to an aspect of the present disclosure, a common mode filter includes: a body including a filter portion and an electrostatic protection portion; first to fourth external electrodes disposed on an external surface of the body; a ground electrode disposed on the external surface of the body; a first coil embedded in the filter portion and electrically connected to the first and second external electrodes; and a second coil embedded in the filter portion and electrically connected to the third and fourth external electrodes. The electrostatic protection portion includes: discharge electrodes electrically connected to at least one of the first to fourth external electrodes and the ground electrode; a discharge part disposed between the discharge electrodes and including conductive particles; a first organic-inorganic composite insulating layer disposed on the discharge electrodes and the discharge part; a magnetic cover layer disposed on the first organic-inorganic composite insulating layer; and a first inorganic insulating layer disposed between the first organic-inorganic composite insulating layer and the magnetic cover layer.

According to another aspect of the present disclosure, a common mode filter includes: a body including a filter portion and an electrostatic protection portion; first to fourth external electrodes disposed on an external surface of the body; a ground electrode disposed on the external surface of the body; a first coil embedded in the filter portion and electrically connected to the first and second external electrodes; a second coil embedded in the filter portion and electrically connected to the third and fourth external electrodes, a coil insulating layer surrounding the first and second coils; and a coil magnetic layer disposed on the coil insulating layer. The electrostatic protection portion is disposed on the coil magnetic layer and includes: discharge electrodes electrically connected to at least one of the first to fourth external electrodes and the ground electrode; a discharge part disposed between the discharge electrodes and including conductive particles; an organic-inorganic composite insulating layer disposed under the discharge electrodes and the discharge part; and an inorganic insulating layer disposed between the organic-inorganic composite insulating layer and the coil magnetic layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Exemplary embodiments in the present disclosure will now be described in detail with reference to the accompanying drawings.

Figure 1:
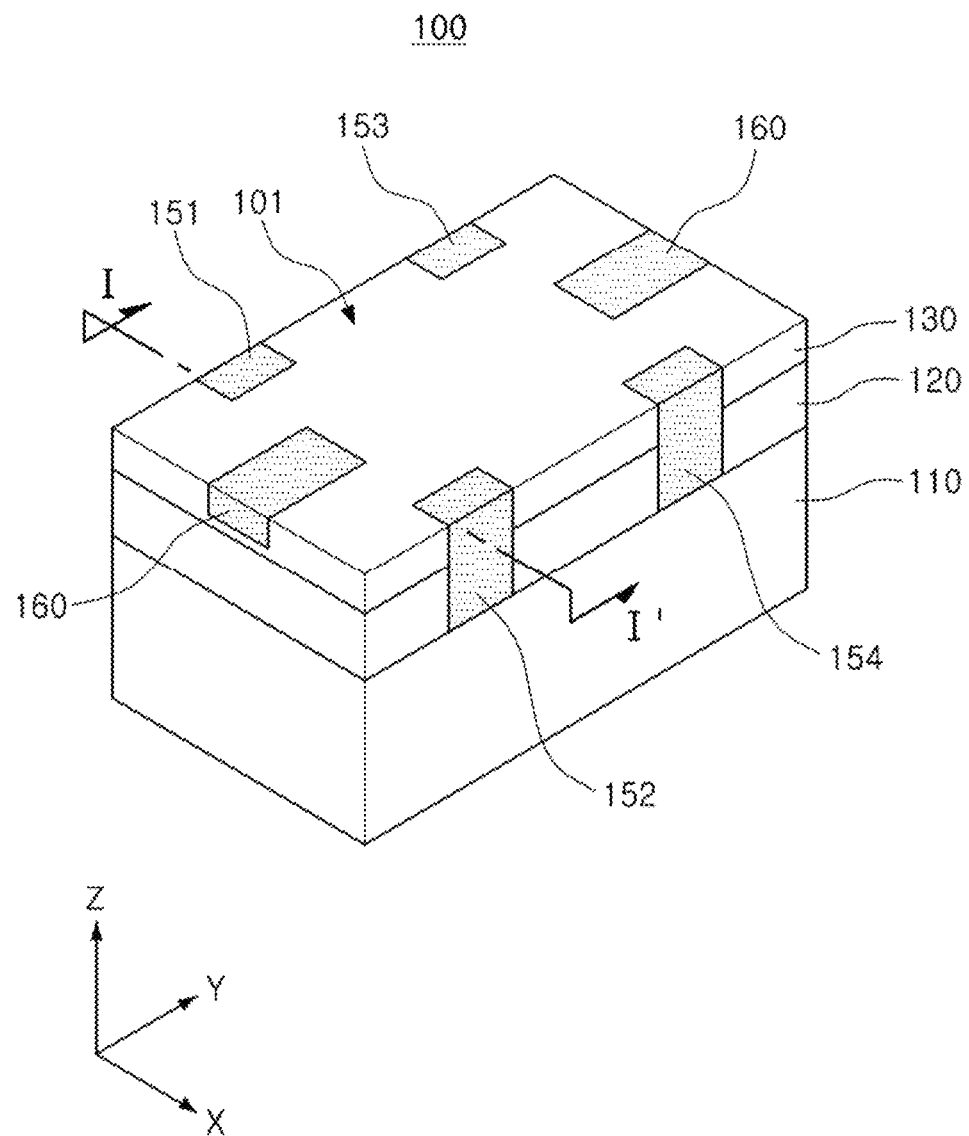
FIG. 1 is a schematic perspective view of a common mode filter according to an exemplary embodiment in the present disclosure.
Figure 2:
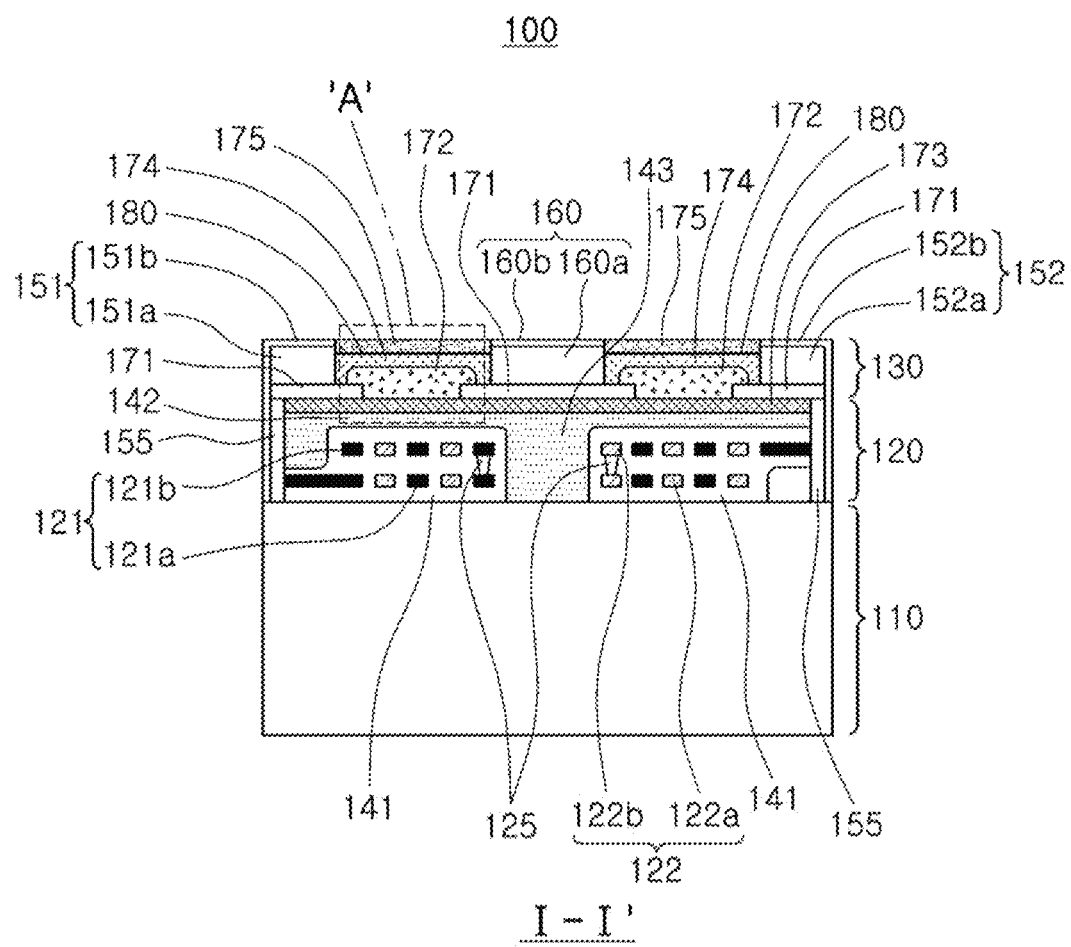
FIG. 2 is a cross-sectional view taken along line I-I' of FIG. 1.
Figure 3:
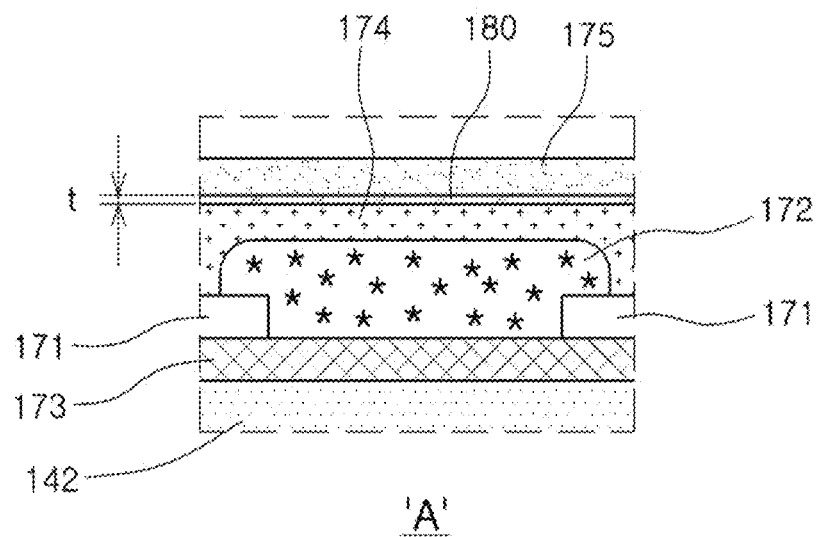
FIG. 3 is a schematic enlarged cross-sectional view of portion "A" of FIG. 2.

FIG. 1 is a schematic perspective view of a common mode filter 100 according to an exemplary embodiment in the present disclosure, FIG. 2 is a cross-sectional view taken along line I-I' of FIG. 1, and FIG. 3 is a schematic enlarged cross-sectional view of portion "A" of FIG. 2.

A structure of the common mode filter 100 according to an exemplary embodiment in the present disclosure will be described with reference to FIGS. 1 to 3.

The common mode filter 100 according to an exemplary embodiment in the present disclosure includes a body 101 and a plurality of external electrodes 151, 152, 153, and 154 and ground electrodes 160 disposed on an external surface of the body 101.

The external electrode 151, 152, 153, and 154 may include first to fourth external electrodes 151, 152, 153, and 154, and the first to fourth external electrodes 151, 152, 153, and 154 may be disposed to be spaced apart from each other. The ground electrodes 160 may also be disposed to be spaced apart from the external electrodes 151, 152, 153, and 154.

As illustrated in FIG. 1, the external electrodes 151, 152, 153, and 154 may be disposed on one surface of the body 101 but are not limited thereto and may also be disposed on a side surface of the body 101.

The external electrodes 151, 152, 153, and 154 and the ground electrodes 160 may be formed of metal posts 151a, 152a, and 160a, and plated layers 151b, 152b, and 160b on surfaces of the metal posts 151a, 152a, and 160a, respectively, but are not limited thereto. In FIGS. 1 to 3, only cross-sections of the first and second external electrodes 151 and 152 are illustrated, but the third and fourth external electrodes 153 and 154 may also have the same structure as that of the first and second external electrodes 151 and 152.

The metal posts 151a, 152a, and 160a may be formed of a metal having excellent conductivity, for example, copper, silver, gold, palladium, nickel, and the like, but are not limited thereto. The plated layers 151b, 152b, and 160b may also be formed of a metal having excellent conductivity, like the metal posts 151a, 152a, and 160a. The metal posts 151a, 152a, and 160a may be formed on discharge electrodes 171 as described hereinafter. Some of the discharge electrodes 171 may be disposed between a connection electrode 155 and the external electrodes 151, 152, 153, and 154 but are not limited thereto.

The external electrodes 151, 152, 153, and 154 are connected to coils 121 and 122 as described hereinafter to input or output a signal. The ground electrodes 160 discharge static electricity formed in the external electrodes 151, 152, 153, and 154. The ground electrodes 160 may also be formed on a filter portion 120, like the external electrodes 151, 152, 153, and 154. The ground electrodes 160 are not electrically connected to the coils 121 and 122 and, as illustrated in FIG. 1, the ground electrodes 160 may be formed between the external electrodes 151, 152, 153, and 154.

The body 101 includes a magnetic substrate 110, the filter portion 120, and an electrostatic protection portion 130.

In FIGS. 1 and 2, the electrostatic protection portion 130 is illustrated as being disposed on the filter portion 120 but is not limited thereto and the electrostatic protection portion 130 may be disposed in another portion of the body 101 under a condition in which an electrical connection relationship between the electrostatic protection portion 130 and the external electrodes or the ground electrodes is the same.

The magnetic substrate 110 is positioned in a lowermost layer of the common mode filter 100 and assumes magnetism. The magnetic substrate 110 may include at least any one of a metal, a polymer, and ceramics as a material assuming magnetism. For example, the magnetic substrate 110 may be a ferrite substrate but is not limited thereto.

The filter portion 120 is disposed on the magnetic substrate 110.

The filter portion 120 includes first and second coils 121 and 122.

Two end portions of the first coil 121 may be electrically connected to the first and second external electrodes 151 and 152, respectively, and two end portions of the second coil 122 may be electrically connected to the third and fourth external electrodes 153 and 154, respectively.

The first and second coils 121 and 122 may have a shape in which a spiral electrode pattern is wound in the same direction.

Since the first and second coils 121 and 122 have a shape in which an electrode pattern is wound in the same direction, when a signal flows in the first and second coils 121 and 122, the first and second coils 121 and 122 act as resistors for a common mode signal to serve to reduce common mode noise.

The first coil 121 includes first spiral electrode patterns 121a and 121b, and the second coil 122 includes second spiral electrode patterns 122a and 122b.

The first electrode patterns 121a and 121b are disposed in spiral form and may be formed to include a metal having excellent electrical conductivity. For example, the first electrode patterns 121a and 121b may be formed of silver (Ag), palladium (Pd), aluminum (Al), nickel (Ni), titanium (Ti), gold (Au), copper (Cu), platinum (Pt), or alloys thereof. The first electrode patterns 121a and 121b may be formed using a plating method, a printing method, a photolithography method, or the like.

The second electrode patterns 122a and 122b are disposed in spiral form and may be formed to include a metal having excellent electrical conductivity. For example, the second electrode patterns 122a and 122b may be formed of silver (Ag), palladium (Pd), aluminum (Al), nickel (Ni), titanium (Ti), gold (Au), copper (Cu), platinum (Pt), or alloys thereof. The second electrode patterns 122a and 122b may be formed using a plating method, a printing method, a photolithography method, and the like.

The first electrode pattern 121a and the second electrode pattern 122a may be formed to be adjacent to each other on the same layer and may not overlap each other, but are not limited thereto. For example, the first electrode pattern 121a and the second electrode pattern 122a may be formed on different layers.

The first electrode pattern 121b and the second electrode pattern 122b may be formed to be adjacent to each other on the same layer and may not overlap each other, but are not limited thereto. For example, the first electrode pattern 121b and the second electrode pattern 122b may be formed on different layers.

The first electrode pattern 121a is wound from an outer side to an inner side, and the first electrode pattern 121b is wound from an inner side to an outer side. Inner end portions of the first electrode patterns 121a and 121b may be electrically connected by a conductive via 125.

The external electrodes 151, 152, 153, and 154 and the coils 121 and 122 may be electrically connected through the connection electrode 155 but are not limited thereto and may also be electrically connected through any other method.

The external electrodes 151, 152, 153, and 154 input a signal to the coils 121 and 122 and output a signal from the coils 121 and 122. Meanwhile, when a coil magnetic layer 142 is positioned on the filter portion 120, the external electrodes 151, 152, 153, and 154 may be formed on the coil magnetic layer 142.

The filter portion 120 may include a coil insulating layer 141. The coil insulating layer 141 may be disposed to surround the first and second coils 121 and 122. The coil insulating layer 141 may insulate the first and second coils 121 and 122 from the magnetic substrate 110, and insulate the first and second coils 121 and 122 from the coil magnetic layer 142 and a magnetic material 143 filling a trench of the coil insulating layer 141 as described hereinafter. The coil insulating layer 141 may be formed on the magnetic substrate 110. As a material of the coil insulating layer 141, a polymer resin having excellent electrical insulating properties and processibility may be used. For example, an epoxy resin, a polyimide resin, and the like, may be used as a material of the coil insulating layer 141.

The coil magnetic layer 142 may be formed on the coil insulating layer 141. The coil magnetic layer 142 forms a closed-magnetic circuit along with the magnetic substrate 110. Magnetic coupling of the first and second coils 121 and 122 may be strengthened by magnetic flux intensively formed by the coil magnetic layer 142 and the magnetic substrate 110.

Also, the magnetic material 143 filling the trench may be disposed in a central portion of the coil insulating layer 141. When the magnetic material 143 filling the trench, is included in the central portion of the coil insulating layer 141, the magnetic substrate 110, the coil magnetic layer 142, and the magnetic material 143 filling the trench form a closed-magnetic circuit.

The coil magnetic layer 142 and the magnetic material 143 filling the trench may be formed as a magnetic resin complex or a ferrite sheet including a magnetic material and a resin material. Magnetic powder allows the coil magnetic layer 142 and the trench 143 to assume magnetism and the resin material serves to enhance chargeability and dispersibility of the magnetic material in the coil magnetic layer 142 and the trench 143. Here, the magnetic powder may include ferrite. Alternatively, the coil magnetic layer 142 and the magnetic material 143 filling the trench may also be formed by stacking and compressing magnetic sheets.

An electrostatic protection portion 130 may be disposed on the filter portion 120. Here, if the electrostatic protection portion 130 is disposed in another position of the body 101, an upper cover part may be disposed on the filter portion 120.

The electrostatic protection portion 130 includes discharge electrodes 171 and a discharge part 172 disposed between the adjacent discharge electrodes 171.

The discharge part 172 is a material having qualities of basically having high resistance which is rapidly lowered when a surge S having a high voltage is introduced. The discharge part 172 may be disposed between the external electrodes 151, 152, 153, and 154 and the ground electrode 160 through the discharge electrode 171. Also, the discharge electrode 171 may be disposed to be electrically connected to at least one of the external electrodes 151, 152, 153, and 154 and the ground electrode 160.

The discharge part 172 may be a resin including metal particles. The metal particles may extend in one direction. According to the discharge part 172, when a voltage is lower than a predetermined value, a current between metal particles may be insulated by the resin, but when a voltage is equal to or higher than the predetermined value, a current flows through the metal particles between the metal particles. Such a predetermined value may be a turn-on voltage (or a reference voltage).

The discharge part 172 may be printed in a screen-printing manner. Here, after a mask including an opening to correspond to a position in which the discharge part 172 is to be formed is disposed on the external electrodes 151, 152, 153, and 154 and the ground electrode 160, the discharge part 172 may be applied to the inside of the opening. Here, the discharge part 172 may be present as a liquid, having fluidity. After being printed, the discharge part 172 may be cured at high temperature.

The metal posts 151a, 152a, and 160a forming the external electrodes 151, 152, 153, and 154 and the ground electrode 160 may serve to prevent the discharge part 172 from flowing to other parts during a process of forming the discharge part 172.

An upper organic-inorganic composite insulating layer 174 may be disposed on the discharge electrode 171 and the discharge part 172. A lower organic-inorganic composite insulating layer 173 may be disposed under the discharge electrode 171 and the discharge part 172. The organic-inorganic composite insulating layer used in the present disclosure refers to an insulating layer formed by dispersing inorganic insulating particles in an organic insulating material. Also, the organic-inorganic composite insulating layer used in the present disclosure may be an Ajinomotor build-up film (ABF) but is not limited thereto.

Also, a magnetic cover layer 175 is disposed on the discharge electrode 171 and the discharge part 172. The magnetic cover layer 175 may include a magnetic material, i.e., ferrite. Since the magnetic cover layer 175 includes a magnetic material, impedance characteristics of the common mode filter 100 may be enhanced.

In the case of related art, when a high voltage (e.g., a voltage of 8 kV) is applied to the electrostatic protection portion, the organic-inorganic composite insulating layer and the magnetic cover layer disposed on the discharge part are degraded and damaged. In order to prevent such a phenomenon, in the related art, a thickness of the discharge part is reduced and a thickness of the organic-inorganic composite insulating layer is increased, but durability of the electrostatic protection portion still has a problem.

Also, a magnetic material generally used in the magnetic cover layer is ferrite having a low specific resistance value of $10^6$ Ωcm, relative to an insulating material (specific resistance value >$10^{16}$ Ωcm). Thus, when dielectric breakdown in which the electrostatic protection portion is damaged by an overvoltage occurs, a leakage current flows to the magnetic cover layer.

Figure 4:
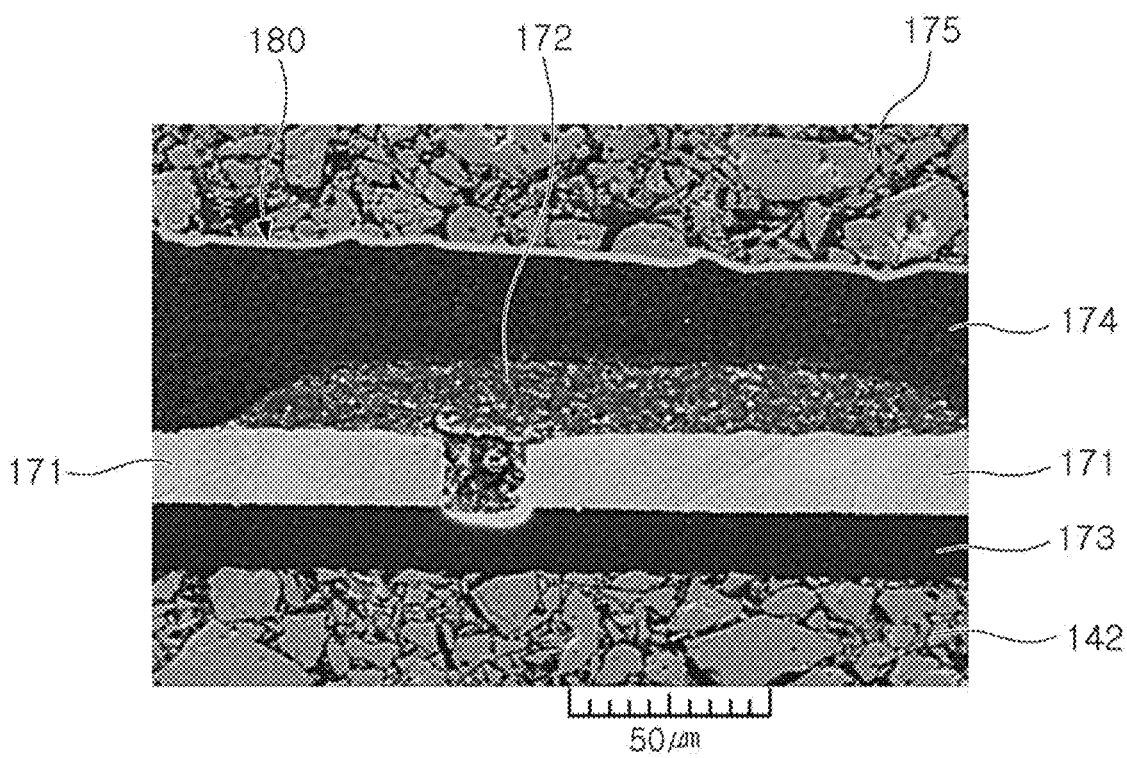
FIG. 4 is a scanning electron microscope (SEM) photograph of a cross-section of an electrostatic protection portion of a common mode filter according to an exemplary embodiment in the present disclosure.

However, in the common mode filter 100 according to an exemplary embodiment in the present disclosure, since an inorganic insulating layer 180 is disposed between the upper organic-inorganic composite insulating layer 174 and the magnetic cover layer 175 as illustrated in FIGS. 3 and 4, the inorganic insulating layer 180 blocks a leakage current on a junction interface between the upper organic-inorganic composite insulating layer 174 and the magnetic cover layer 175, enhancing insulating characteristics of the electrostatic protection portion 130.

The inorganic insulating layer 180 may include at least one of $SiO_2$, nanoclay, and alumina and may be formed through deposition, spraying, dipping, or coating method, but is not limited thereto.

TABLE 1

| | Thickness (μm) of inorganic insulating layer | | | | |
|---|---|---|---|---|---|
| | 0 | 0.2 | 0.5 | 1.0 | 2.0 |
| Leakage current (μA) | 15.5 | 0.47 | 0.0120 | 0.0027 | 0.0014 |

Table 1 shows a result of measuring a leakage current in a state in which a voltage of 5V is applied after a voltage of 8 kV is applied to the electrostatic protection portion ten times, while changing a thickness t of the inorganic insulating layer. Target characteristics are to satisfy a leakage current less than 1.0 μA.

Referring to Table 1, it can be seen that, when the thickness t of the inorganic insulating layer is 0.2 μm or greater, a leakage current is 0.47 μA or less, satisfying target characteristics. In particular, it can be seen that, when the thickness t of the inorganic insulating layer is 0.5 μm or greater, the leakage current is significantly reduced to 0.0120 μA.

However, if the thickness t of the inorganic insulating layer is too large, a thickness of the magnetic cover layer may inevitably be reduced to degrade impedance characteristics of the common mode filter.

Thus, the thickness t of the inorganic insulating layer 180 may be equal to or greater than 0.2 μm and smaller than a thickness at which the impedance characteristics of the common mode filter 100 can be maintained.

Figure 5:
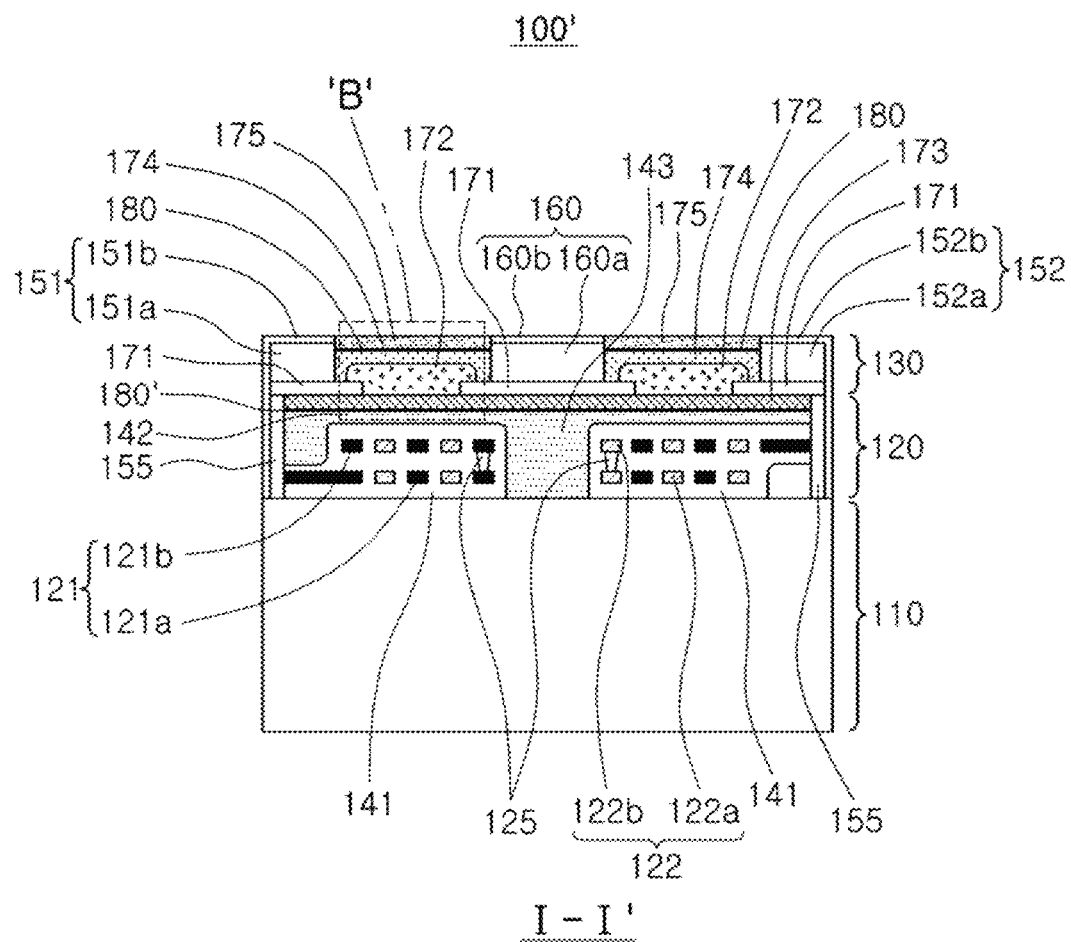
FIG. 5 is a schematic cross-sectional view of a common mode filter according to another exemplary embodiment in the present disclosure.
Figure 6:
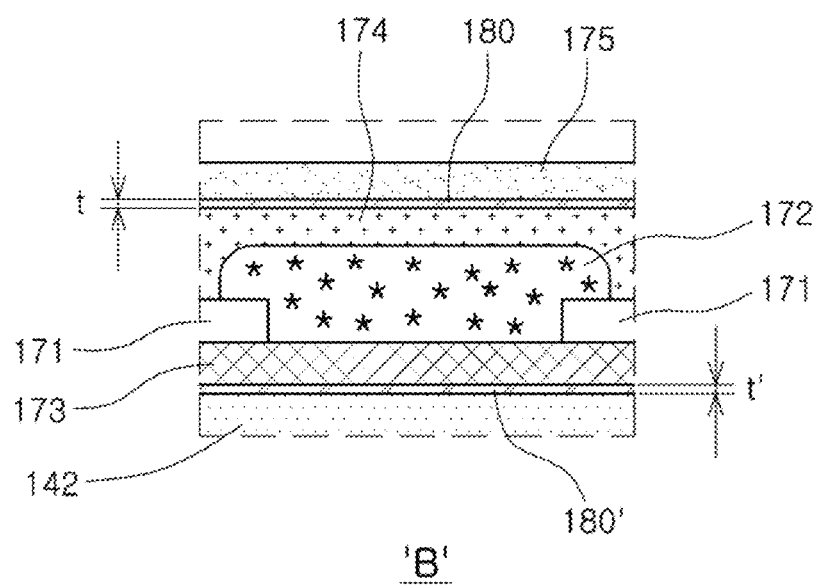
FIG. 6 is an enlarged cross-sectional view of portion "B" of FIG. 5.

FIG. 5 is a schematic cross-sectional view of a common mode filter 100' according to another exemplary embodiment in the present disclosure, and FIG. 6 is an enlarged cross-sectional view of part "B" of FIG. 5.

Descriptions of the same components as those of the common mode filter 100 according to an exemplary embodiment in the present disclosure described above will be omitted.

When the electrostatic protection portion 130 is disposed on the filter portion 120, that is, when the electrostatic protection portion 130 is disposed on the coil magnetic layer 142, a lower organic-inorganic composite insulating layer 173 may be disposed under the discharge electrode 171 and the discharge part 172.

As illustrated in FIG. 6, in the common mode filter 100' according to another exemplary embodiment in the present disclosure, since an inorganic insulating layer 180' is disposed between the lower organic-inorganic composite insulating layer 173 and the coil magnetic layer 142, the inorganic insulating 180' blocks a leakage current in a junction interface of the organic-inorganic composite insulating layer 173 and the coil magnetic layer 142, enhancing insulating properties of the electrostatic protection portion 130.

That is, in addition to enhancement of impedance characteristics of the common mode filter 100' due to the presence of the coil magnetic layer 142, insulating properties of the electrostatic protection portion 130 may be enhanced due to the presence of the inorganic insulating layer 180' disposed between the organic-inorganic composite insulating layer 173 and the coil magnetic layer 142.

The inorganic insulating layer 180' may include at least one of $SiO_2$, nanoclay, and alumina and may be formed through deposition, spraying, dipping, or coating method, but is not limited thereto.

Also, the thickness t' of the inorganic insulating layer 180' may be equal to or greater than 0.2 μm and smaller than a thickness by which the impedance characteristics of the common mode filter 100' are maintained.

As set forth above, in the electrostatic protection portion of the common mode filter according to an exemplary embodiment in the present disclosure, since the inorganic insulating layer is disposed between the organic-inorganic composite insulating layer and the magnetic cover layer, occurrence of a leakage current in the electrostatic protection portion may be prevented when an overvoltage such as static electricity is applied.

While example embodiments have been shown and described above, it will be apparent to those skilled in the art that modifications and variations could be made without departing from the scope of the present invention as defined by the appended claims.

What is claimed is:

1. A common mode filter comprising:
   a body including a filter portion and an electrostatic protection portion;
   first to fourth external electrodes disposed on an external surface of the body;
   a ground electrode disposed on the external surface of the body;
   a first coil embedded in the filter portion and electrically connected to the first and second external electrodes; and
   a second coil embedded in the filter portion and electrically connected to the third and fourth external electrodes,
   wherein the electrostatic protection portion includes:
   discharge electrodes electrically connected to at least one of the first to fourth external electrodes and the ground electrode;
   a discharge part disposed between the discharge electrodes and including conductive particles;
   a first organic-inorganic composite insulating layer disposed on the discharge electrodes and the discharge part;
   a magnetic cover layer disposed on the first organic-inorganic composite insulating layer; and
   a first inorganic insulating layer disposed between the first organic-inorganic composite insulating layer and the magnetic cover layer.

2. The common mode filter of claim 1, wherein the first inorganic insulating layer includes at least one of $SiO_2$, nanoclay, and alumina.

3. The common mode filter of claim 1, wherein a thickness of the first inorganic insulating layer is 0.2 μm or greater.

4. The common mode filter of claim 1, wherein the magnetic cover layer includes ferrite.

5. The common mode filter of claim 1, further comprising:
   a coil insulating layer surrounding the first and second coils and including a trench penetrating through a central portion in a thickness direction; and
   a coil magnetic layer disposed on the coil insulating layer and in the trench.

6. The common mode filter of claim 5, wherein
   the electrostatic protection portion is disposed on the coil magnetic layer and further includes:
   a second organic-inorganic composite insulating layer disposed under the discharge electrode and the discharge part; and
   a second inorganic insulating layer disposed between the second organic-inorganic composite insulating layer and the coil magnetic layer.

7. The common mode filter of claim 6, wherein the second inorganic insulating layer includes at least one of $SiO_2$, nanoclay, and alumina.

8. The common mode filter of claim 6, wherein a thickness of the second inorganic insulating layer is 0.2 μm or greater.

9. The common mode filter of claim 1, wherein the discharge part includes a resin layer in which metal particles are dispersed.

10. A common mode filter comprising:
    a body including a filter portion and an electrostatic protection portion;
    first to fourth external electrodes disposed on an external surface of the body;
    a ground electrode disposed on the external surface of the body;
    a first coil embedded in the filter portion and electrically connected to the first and second external electrodes;

a second coil embedded in the filter portion and electrically connected to the third and fourth external electrodes;

a coil insulating layer surrounding the first and second coils; and a coil magnetic layer disposed on the coil insulating layer, wherein the electrostatic protection portion is disposed on the coil magnetic layer, and the electrostatic protection portion includes:

discharge electrodes electrically connected to at least one of the first to fourth external electrodes and the ground electrode;

a discharge part disposed between the discharge electrodes and including conductive particles;

an organic-inorganic composite insulating layer disposed under the discharge electrodes and the discharge part; and an inorganic insulating layer disposed between the organic-inorganic composite insulating layer and the coil magnetic layer.

11. The common mode filter of claim 10, wherein the inorganic insulating layer includes at least one of $SiO_2$, nanoclay, and alumina.

12. The common mode filter of claim 10, wherein a thickness of the inorganic insulating layer is 0.2 μm or greater.

13. The common mode filter of claim 10, wherein the coil magnetic layer includes ferrite.

14. The common mode filter of claim 10, wherein the coil insulating layer includes a trench penetrating through a central portion of the coil insulating layer, a magnetic material filling the trench.

15. The common mode filter of claim 10, wherein the discharge part includes a resin layer in which metal particles are dispersed.

* * * * *